(12) United States Patent
Knapp et al.

(10) Patent No.: US 8,014,886 B2
(45) Date of Patent: Sep. 6, 2011

(54) METHOD AND SYSTEM FOR GENERATING AN ASSEMBLY CONFIGURATION

(75) Inventors: David Michael Knapp, Waterford, MI (US); Alan George David Fisk, Farmington Hills, MI (US); Gary Stuart Wallace, Maidstone (GB)

(73) Assignee: Ford Motor Company, Dearborn, MI (US)

( * ) Notice: Subject to any disclaimer, the term of this patent is extended or adjusted under 35 U.S.C. 154(b) by 200 days.

(21) Appl. No.: 12/118,954

(22) Filed: May 12, 2008

(65) Prior Publication Data

US 2009/0281651 A1 Nov. 12, 2009

(51) Int. Cl.
*G06F 19/00* (2011.01)
(52) U.S. Cl. ............... 700/107; 700/98; 700/182; 703/8
(58) Field of Classification Search ............ 700/95, 700/97, 98, 103, 106, 107, 117, 118, 182; 703/1, 6, 7, 8; 705/29
See application file for complete search history.

(56) References Cited

U.S. PATENT DOCUMENTS

| | | | |
|---|---|---|---|
| 4,862,376 A | 8/1989 | Ferriter et al. | |
| 5,907,489 A * | 5/1999 | Elliott | 700/97 |
| 6,223,094 B1 * | 4/2001 | Muehleck et al. | 700/107 |
| 6,453,209 B1 * | 9/2002 | Hill et al. | 700/95 |
| 6,844,877 B1 | 1/2005 | Rajkumar et al. | |
| 6,871,108 B2 * | 3/2005 | Carlucci et al. | 700/98 |
| 6,928,331 B2 | 8/2005 | Wishengrad | |
| 6,996,503 B2 | 2/2006 | Jung | |
| 7,085,776 B2 | 8/2006 | Callahan | |
| 7,103,519 B2 * | 9/2006 | Singarajan et al. | 703/8 |
| 7,136,713 B2 | 11/2006 | Mok et al. | |
| 7,209,869 B1 * | 4/2007 | Kroger et al. | 703/1 |
| 7,302,443 B2 * | 11/2007 | Nakajima et al. | 700/107 |
| 2003/0204527 A1 | 10/2003 | Callahan | |
| 2004/0148145 A1 | 7/2004 | Chen et al. | |
| 2004/0167650 A1 | 8/2004 | Nasu | |
| 2005/0203718 A1 | 9/2005 | Carek et al. | |
| 2005/0261793 A1 | 11/2005 | Angelo | |
| 2006/0064393 A1 | 3/2006 | Orr | |
| 2007/0067146 A1 | 3/2007 | Devarajan et al. | |
| 2007/0192302 A1 | 8/2007 | Qamhiyah et al. | |
| 2007/0288504 A1 | 12/2007 | Kagawa et al. | |
| 2008/0062170 A1 | 3/2008 | Satoh et al. | |
| 2010/0106466 A1 | 4/2010 | Frohlich et al. | |

* cited by examiner

*Primary Examiner* — Charles R Kasenge
(74) *Attorney, Agent, or Firm* — Raymond L. Coppiellie; Brooks Kushman P.C.

(57) ABSTRACT

A bill of material and a design layout are aligned to generate a configuration for a virtual vehicle. The bill of material includes a part number and usage associated with a part. The design layout includes a CAD model of the part. CAD models in vehicle position are generated from the design layout. Logical positions are identified based on the usage and the CAD models in vehicle position are associated with the logical positions. Feature conditions are applied to the CAD models in vehicle position representing content and position configuration.

5 Claims, 12 Drawing Sheets

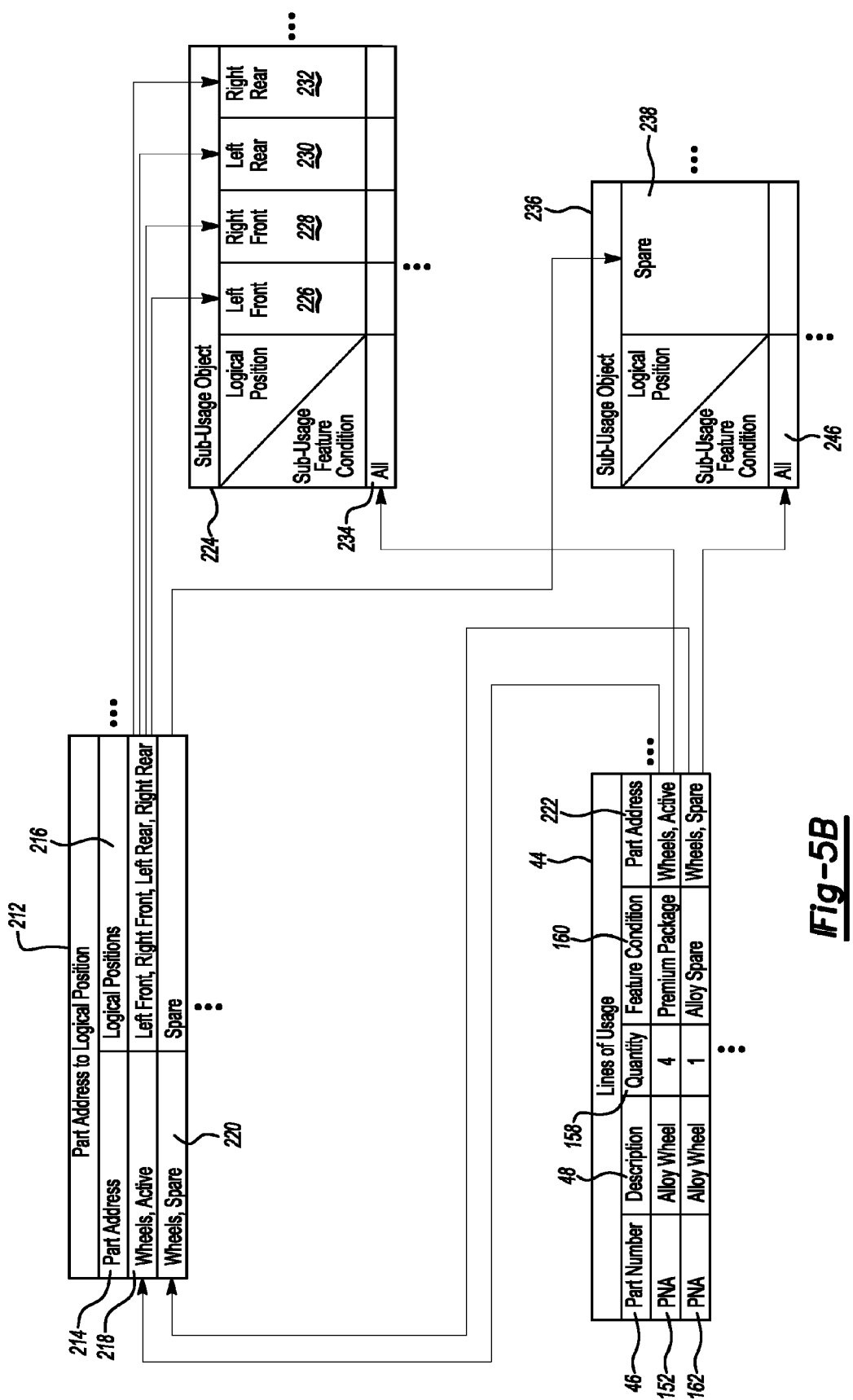

METHOD AND SYSTEM FOR GENERATING AN ASSEMBLY CONFIGURATION

BACKGROUND

1. Field of the Invention

The invention relates to methods and systems for generating assembly configurations.

2. Discussion

A Bill of Materials (BOM) for a vehicle, e.g., a list of parts with associated conditions of use, may be an authoritative source of part content, usage condition, and effectivity information. A Computer Aided Design (CAD) product structure for a vehicle may be an authoritative source of part geometric and location information. To create a virtual assembly of a vehicle based on the BOM and CAD product structure, information from each may be required.

SUMMARY

Embodiments of the invention may take the form of a method for generating a configuration of an assembly from a design layout and a bill of material. The method includes mapping a geometric representation of a part to a part reference, generating positioned geometric representations of the part based on the mapping of the geometric representation of the part to the part reference, and identifying a logical position associated with the part based on a part address. The method also includes mapping the positioned geometric representations of the part to the logical position based on logical position zones, identifying a plurality of feature conditions based on the part reference and the part address, and mapping each of the positioned geometric representations of the part to one of the feature conditions.

Embodiments of the invention may take the form of a system for generating a configuration of an assembly from a design layout and a bill of material. The system includes one or more computers configured to perform the method described above.

BRIEF DESCRIPTION OF THE DRAWINGS

FIG. 5B is an example illustration of the method of FIG. 5A.

DETAILED DESCRIPTION

Figure 1:
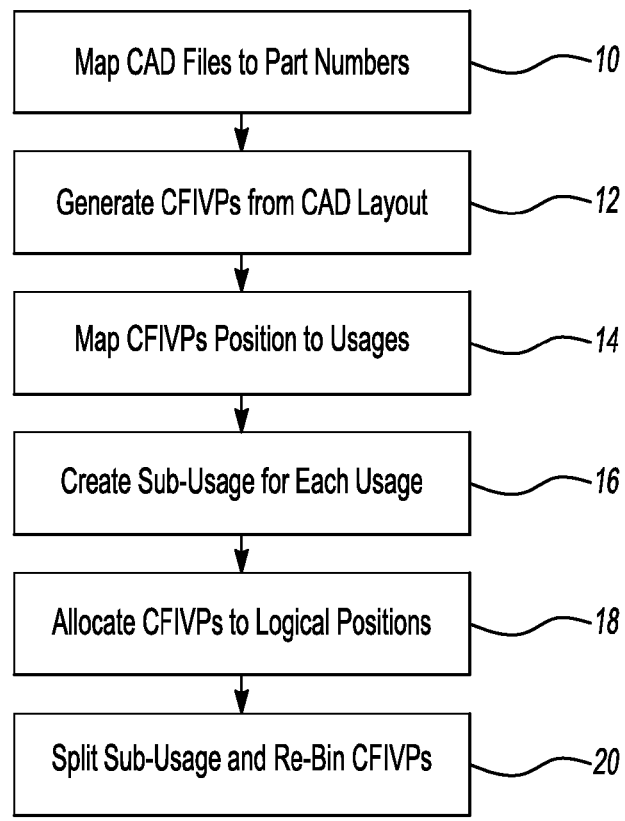
FIG. 1 is a flow chart of an example method for aligning a vehicle Bill Of Material (BOM) with a vehicle Computer Aided Design (CAD) layout.

Embodiments of the invention provide information constructs that systematically connect information in a BOM with information in a CAD product structure. One such construct is the sub-usage. Some traditional BOMs may be a flat list of usages, each potentially including a part number, quantity, usage condition, and effectivity. Here, each usage may have one or more sub-usages associated with it. If the part has no positional variation in the vehicle, e.g., front bumper, there is one sub-usage. If the part has positional variation in the vehicle, e.g., pickup tailgate, there are multiple sub-usages. If there are multiple sub-usages, each may carry a feature condition, e.g., a Boolean expression of features that defines when a line of usage is included in a vehicle. For example, if the vehicle features include "Premium Package," four alloy wheels would be applied. If the vehicle features include crew cab and 8' box, a crew cab and 8' box would be applied. A sub-usage may also carry its own effectivity to coordinate the introduction of revised part geometry and position.

A second construct is the logical position. In some traditional BOMs, usages are quantified, e.g., one usage for tires having a quantity of four. In some traditional CAD structures, however, each positioned occurrence of a part is treated separately. Here, logical positions bridge this gap by, for example, providing named instances of the part, e.g., left front tire, right front tire, etc.

A third construct is the usage cell. A grid with sub-usages as rows and logical positions as columns, for example, would have a usage cell at the intersection of each row and column. A usage cell may provide a place to attach positioned geometric representations.

A fourth construct is a design usage. A design usage may be a geometric representation, e.g., CAD model, at a specific position in space. Design usages may be created individually using, for example, a CAD tool. Design usages may also be created by extracting positioned instances from a CAD structure. As such, multiple design usages may reference the same geometric representation giving it multiple positions in space.

A fifth construct is a design group. A design group may be a set of design usages and may be used to associate a set of design usages with one or more usage cells. A single design usage may be referenced by multiple design groups.

The following examples illustrate the coordinated use of at least some of the above constructs. Assuming two types of tires, e.g., standard and off-road, and one type of wheel, e.g., steel, a BOM system would contain two related usages. The first usage would reference the standard wheel/tire assembly with quantity "4" and usage condition "standard." The second usage would reference the off-road wheel/tire assembly with quantity "4" and usage condition "off-road." Assuming two types of wheel bases, e.g., 133" and 150", the first usage would have three sub-usages and four logical positions. The first sub-usage would cover the left and right front logical positions and have no sub-usage conditions. The second sub-usage would cover the left and right rear logical positions with a sub-usage condition of "wheelbase 133". The third sub-usage would cover the left and right rear logical positions with a sub-usage condition of "wheelbase 150". The second usage would similarly have three sub-usages and four logical positions. For each usage, this results in a total of six usage cells.

Although the constructs, e.g., the sub-usage to support positional variation, the logical position to identify design occurrences for a summarized line of usage, etc., allow a BOM environment and a CAD environment to be connected, this connection may require knowledge of the information in both environments to bridge the gap between them. For example, alignment may be achieved by having a part number used in both the BOM and CAD environments. Alignment to a correct sub-usage and logical position for an identified line of usage, e.g., a row in a BOM that includes attributes of the part and the way part is applied to the vehicle, however, still may require additional information that may need to be manually provided by a CAD operator.

Alignment may also be achieved based on inferences from a geometric position of design occurrences in vehicle space in relation to other design occurrences. These inferences may assume that a vehicle coordinate system is consistently used. For example, +X points toward the front of a vehicle, +Y points toward the left side of a vehicle, and, +Z points toward the top of a vehicle. Geometric meaning may then be assigned to sequences of defined logical names based on the X, Y, Z values of a design occurrence in relation to another design occurrence for the same part number. For example, "Left" has a Y value greater than "Right," "Front" has an X value greater than "Rear," and "Upper" has a Z value greater than "Lower." Complex inferences may also be drawn. For example, the four corners of a vehicle may be identified as X(Left Front) <X(Right Rear), Y(Left Front)>Y(Right Rear). A series of named positions may be identified as X(Position 1)<X(Position 2)< . . . <X(Position n).

FIG. 1 is a flow chart of an example method for aligning a vehicle Bill Of Material (BOM) with a vehicle Computer Aided Design (CAD) layout. This and other similar methods may be used to generate, for example, a virtual mock-up of a vehicle, or portions of a vehicle.

At 10, CAD files of vehicle parts are mapped to corresponding part numbers. At 12, CAD files in vehicle position (CFIVPs) are generated from a CAD layout. At 14, CFIVPs are mapped to usages. At 16, a sub-usage is created for each usage. At 18, CFIVPs are allocated to logical positions. At 20, each sub-usage is split and the CFIVPs are re-binned.

Figure 2A:
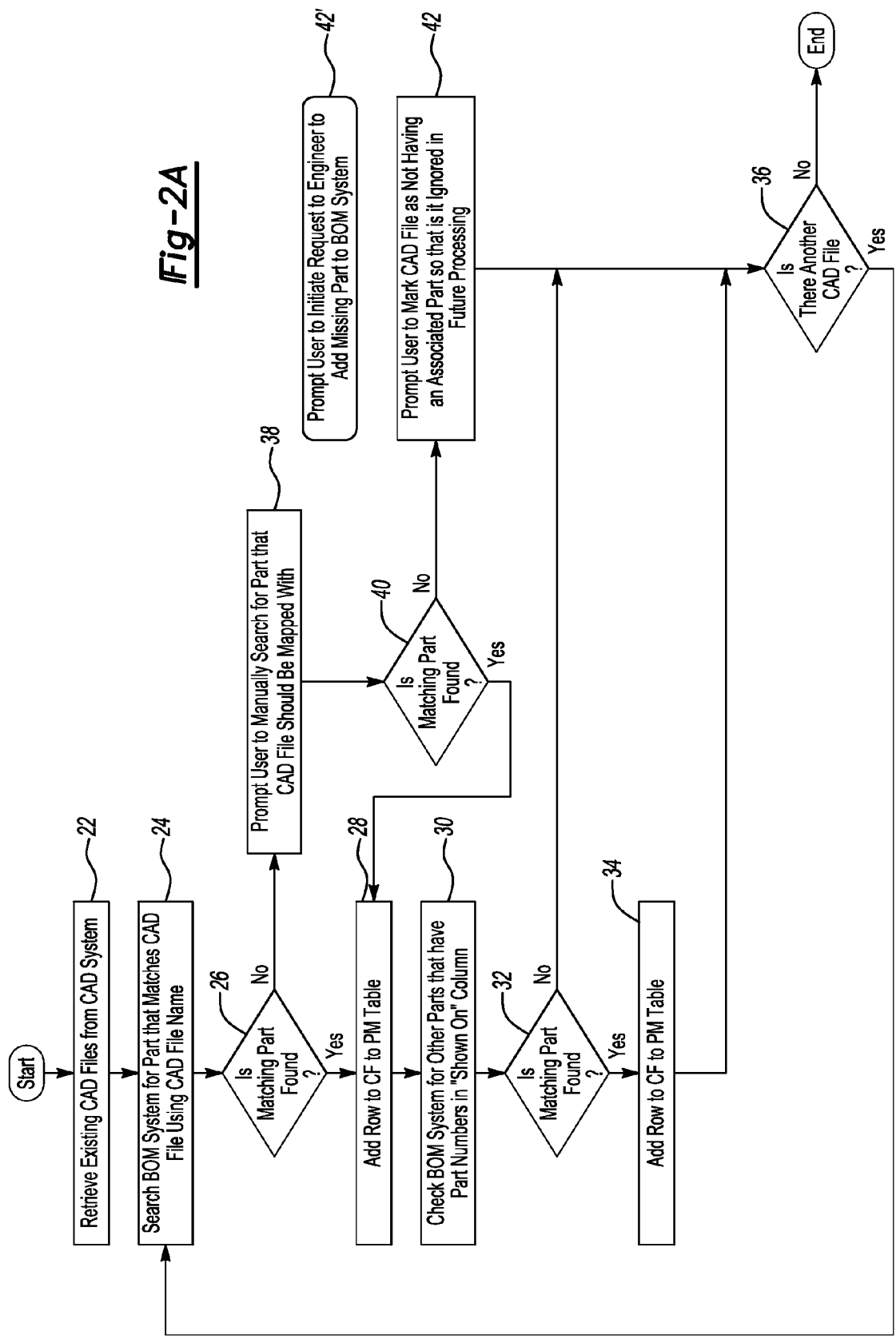
FIG. 2A is a flow chart of an example method for mapping CAD files to part numbers.

FIG. 2A is a flow chart of an example method for mapping CAD files to part numbers. At 22, existing CAD files are retrieved from a CAD system. At 24, a BOM system is searched for a part that matches a CAD file using the CAD file name. At 26, it is determined whether a matching part is found. If yes, at 28, a row is added to a CAD file to part mapping (CF to PM) table. At 30, the BOM system is checked for other parts that have part numbers shown in a "shown on" column. At 32, it is determined whether a matching part is found. If yes, at 34, a row is added to the CF to PM table. At 36, it is determined whether there is another CAD file. If yes, the method returns to step 24. If no, the method ends.

Referring to step 26, if no, at 38, a user is prompted to manually search for a part to map with the CAD file. At 40, it is determined whether a matching part is found. If yes, the method proceeds to 34. If no, at 42, the user is prompted to mark the CAD file as not having an associated part so that it is ignored in future processing. Alternatively, at 42', the user is prompted to initiate a request to the engineer to add the missing part to the BOM system. The method then proceeds to step 36.

Referring to step 32, if no, the method proceeds to step 36.

Figure 2B:
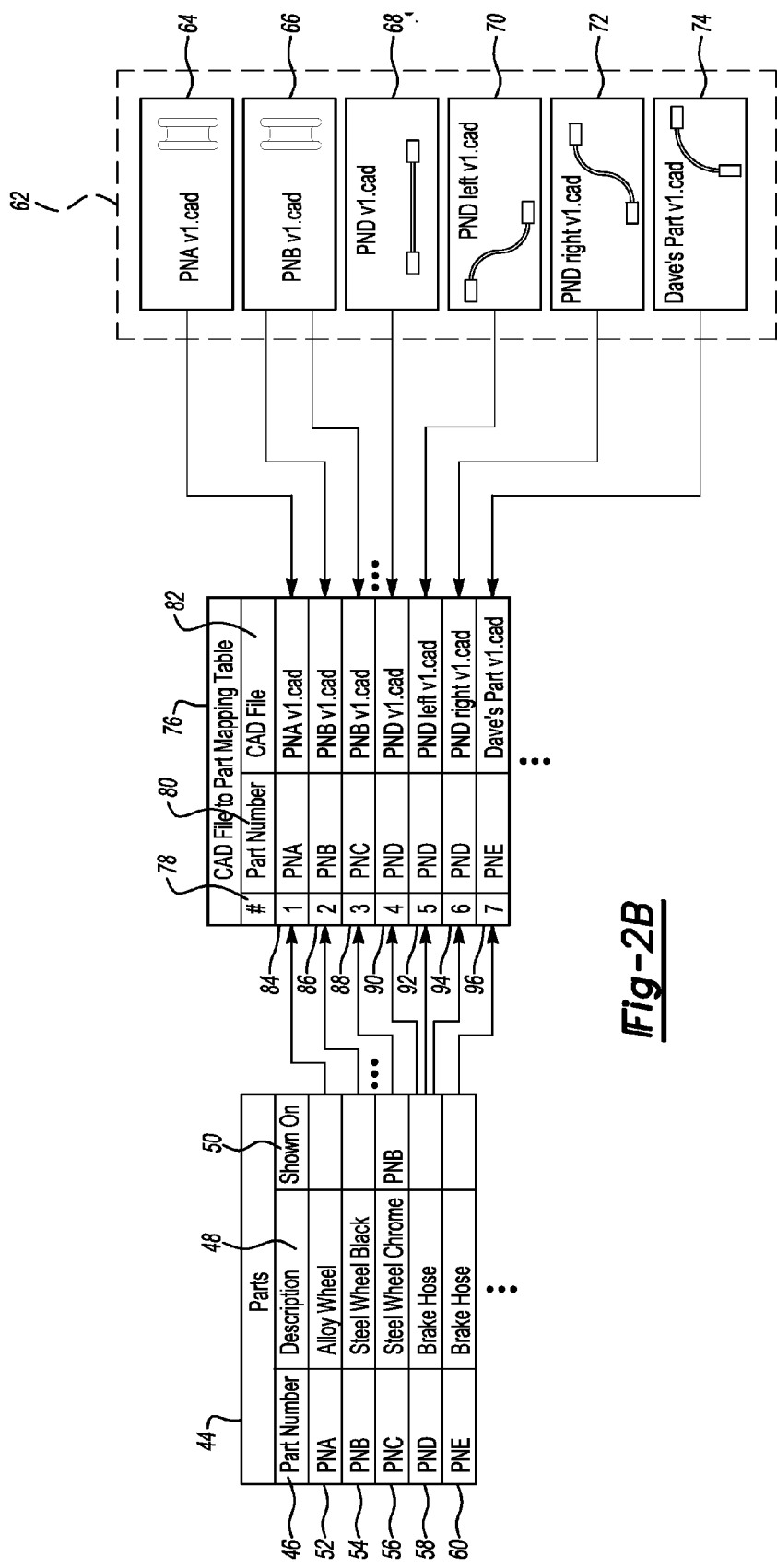
FIG. 2B is an example illustration of the method of FIG. 2A.

FIG. 2B is an example illustration of the method of FIG. 2A. In the example of FIG. 2B, BOM system 44 includes column headings for part number 46, description 48, and shown on 50. In this example, BOM system 44 includes other information not shown in FIG. 2B, but shown in subsequent Figures, to achieve clarity. Other tables discussed herein show some information in some Figures and other information in other Figures, again, to achieve clarity. Rows 52-60 of BOM system 44 include information for particular parts by part number. For example, row 56 has part number "PNC," description "Steel Wheel Chrome," and shown on "PNB."

In the example of FIG. 2B, CAD system 62 includes CAD data for particular parts 64, 66, 68, 70, 72, 74 identified by file name, e.g., "PNA v1.cad" includes geometric data for a wheel, "PND left v1.cad" includes geometric data for a brake hose. By convention, most of the file names include the part number to which it corresponds, e.g., "PNA v1.cad" in CAD system 62 corresponds to part number "PNA" in row 52 of BOM 44.

CF to PM table 76 of FIG. 2B includes column headings for row identifier 78, e.g., "#", part number 80, and CAD file 82. Other CF to PM tables may include different column headings. Rows 84-96 were generated by executing the steps of FIG. 2A. For example, rows 84, 90, 92, 94 were generated by executing steps 22-32 and 36 of FIG. 2A. Rows 86, 88 were generated by executing steps 22-36 of FIG. 2A. Row 96 was generated by executing steps 22-26, 38-42, and 36 of FIG. 2A.

Figure 3A:
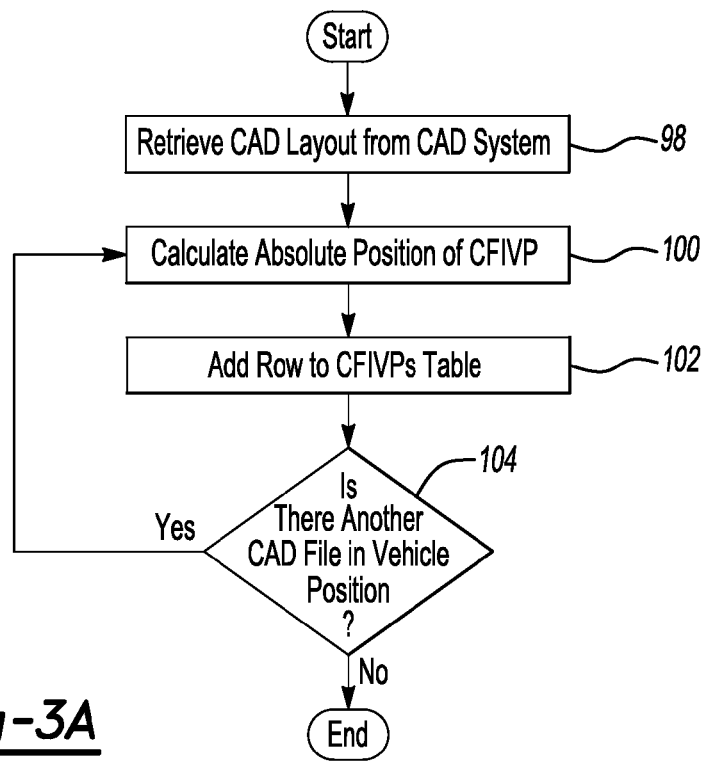
FIG. 3A is a flow chart of an example method for generating CAD files in vehicle position (CFIVPs) from a CAD layout.

FIG. 3A is a flow chart of an example method for generating CFIVPs from a CAD layout. At 98, a CAD layout from a CAD system is retrieved. At 100, the absolute position of a CFIVP is calculated. At 102, a row is added to a CFIVPs table. At 104, it is determined whether there is another CAD file in vehicle position. If yes, the method returns to 100. If no, the method ends.

Figure 3B:
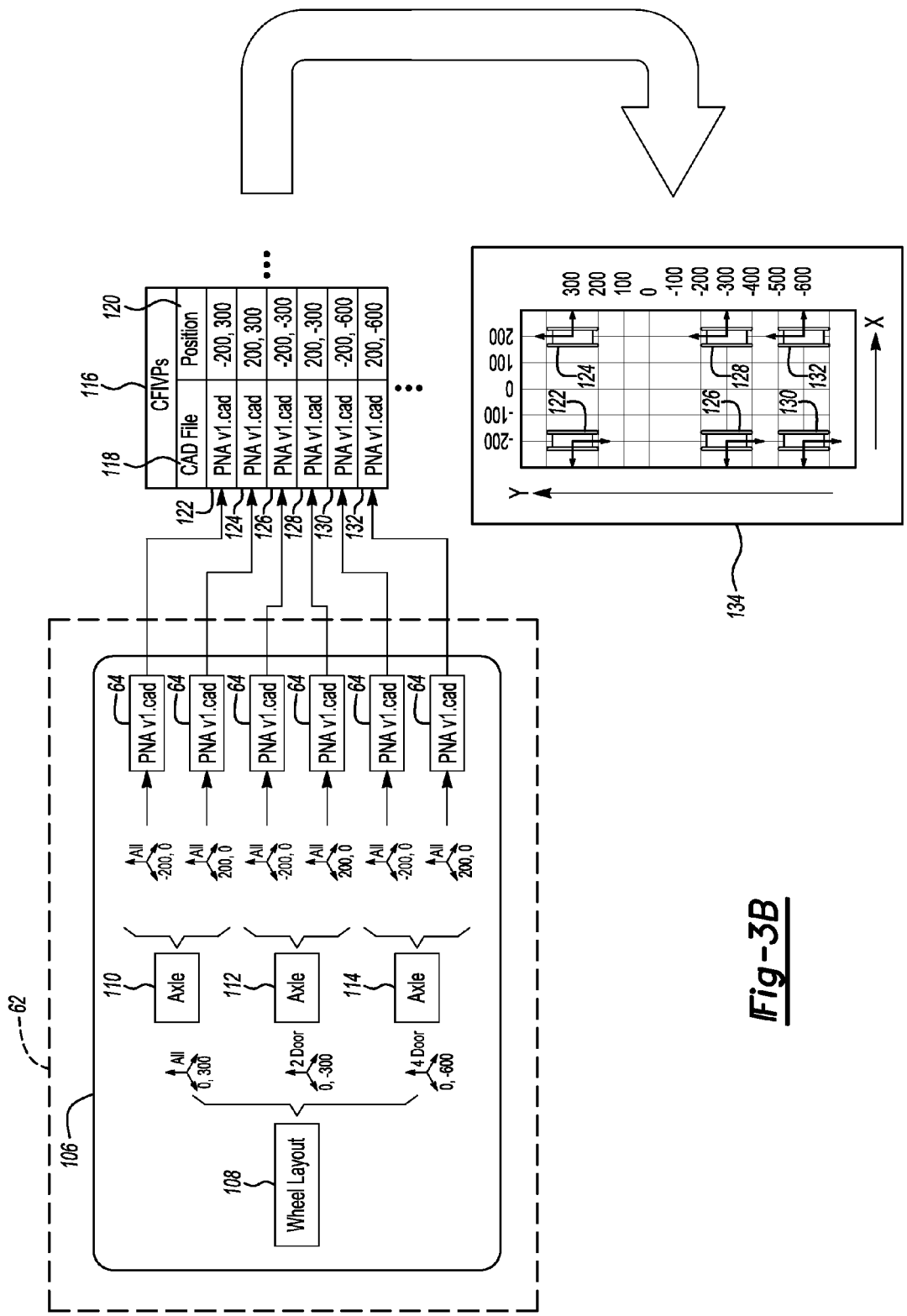
FIG. 3B is an example illustration of the method of FIG. 3A.

FIG. 3B is an example illustration of the method of FIG. 3A. In the example of FIG. 3B, CAD layout 106, e.g., design layout, is a tree composed of a CAD assembly, e.g., wheel layout 108, which refers to other nested CAD assemblies, e.g., axles 110, 112, 114, etc., which define the position, e.g., location and orientation, of individual CAD files, e.g., "PNA v1.cad," in the vehicle.

CFIVPs table 116 includes column headings for CAD file 118 and position 120. Rows 122-132 were generated by executing the steps of FIG. 3A. For example, row 122 was generated by executing steps 98-102 of FIG. 3A. Working along the upper branch of CAD layout 106 to "PNA v1.cad," the relative position of [0, 300] between wheel layout 108 and axle 110 is multiplied by the relative position of [−200, 0] between axle 110 and "PNA v1.cad" yielding an absolute position of [−200, 300, 0].

Chart 134 is a graphical representation of rows 122-132 of CFIVPs table 116. For example, for row 122, the geometric data associated with "PNA v1.cad" is shown in position [−200, 300].

Figure 4A:
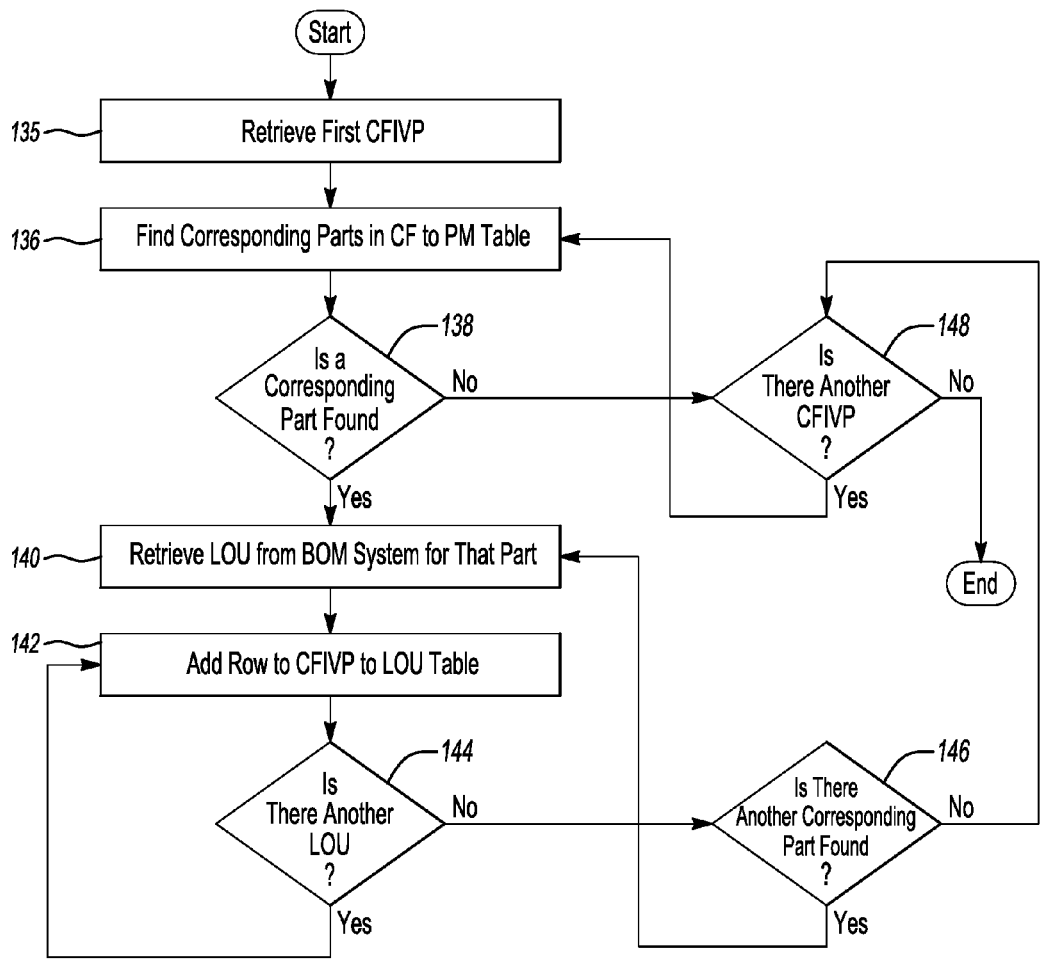
FIG. 4A is a flow chart of an example method for mapping CFIVPs to usages.

FIG. 4A is a flow chart of an example method for mapping CFIVPs to usages. At 135, a first CFIVP is retrieved. At 136, corresponding parts are found in a CF to PM table. At 138, it is determined whether a corresponding part is found. If yes, at 140, lines of usage (LOU) for that part are retrieved from a BOM system. At 142, a row is added to a CFIVP to LOU table. At 144, it is determined whether there is another LOU. If yes, the method returns to 142. If no, at 146, it is determined whether there is another part. If yes, the method returns to 140. If no, at 148, it is determined whether there is another CFIVP. If yes, the method returns to 136. If no, the method ends.

Figure 4B:
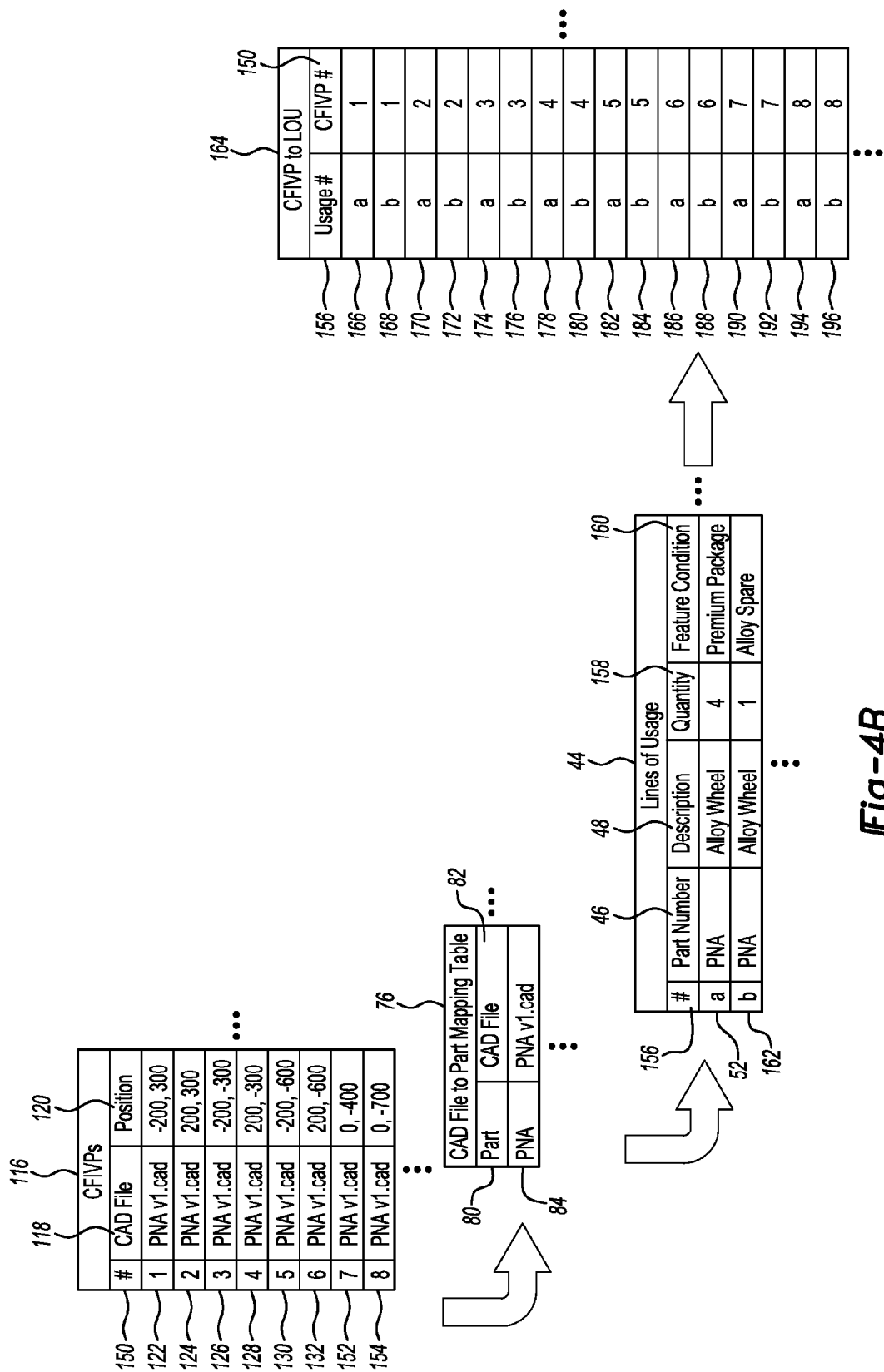
FIG. 4B is an example illustration of the method of FIG. 4A.

FIG. 4B is an example illustration of the method of FIG. 4A. CFIVPs table 116 of FIG. 4B includes a column heading for row identifier 150, e.g., "#." CFIVPs table 116 of FIG. 4B further includes rows 152, 154.

BOM system 44 of FIG. 4B shows certain LOU information, e.g., part number and feature condition. BOM system 44 of FIG. 4B includes column headings for row identifier 156, e.g., "#," quantity 158, and feature condition 160. BOM system 44 further includes row 162.

CFIVP to LOU table 164 includes column headings for usage row identifier 156 and CFIVP row identifier 150. Rows 166-196 of CFIVP to LOU table 164 were generated by executing steps 136-148 of FIG. 4A. CFIVP to LOU table 164 relates information in BOM system 44 to information in CFIVPs table 116. For example, the information of row 52 of BOM system 44 can be linked with the information of row 122 of CFIVPs table 116 via row 166 of CFIVP to LOU table 164.

Figure 5A:
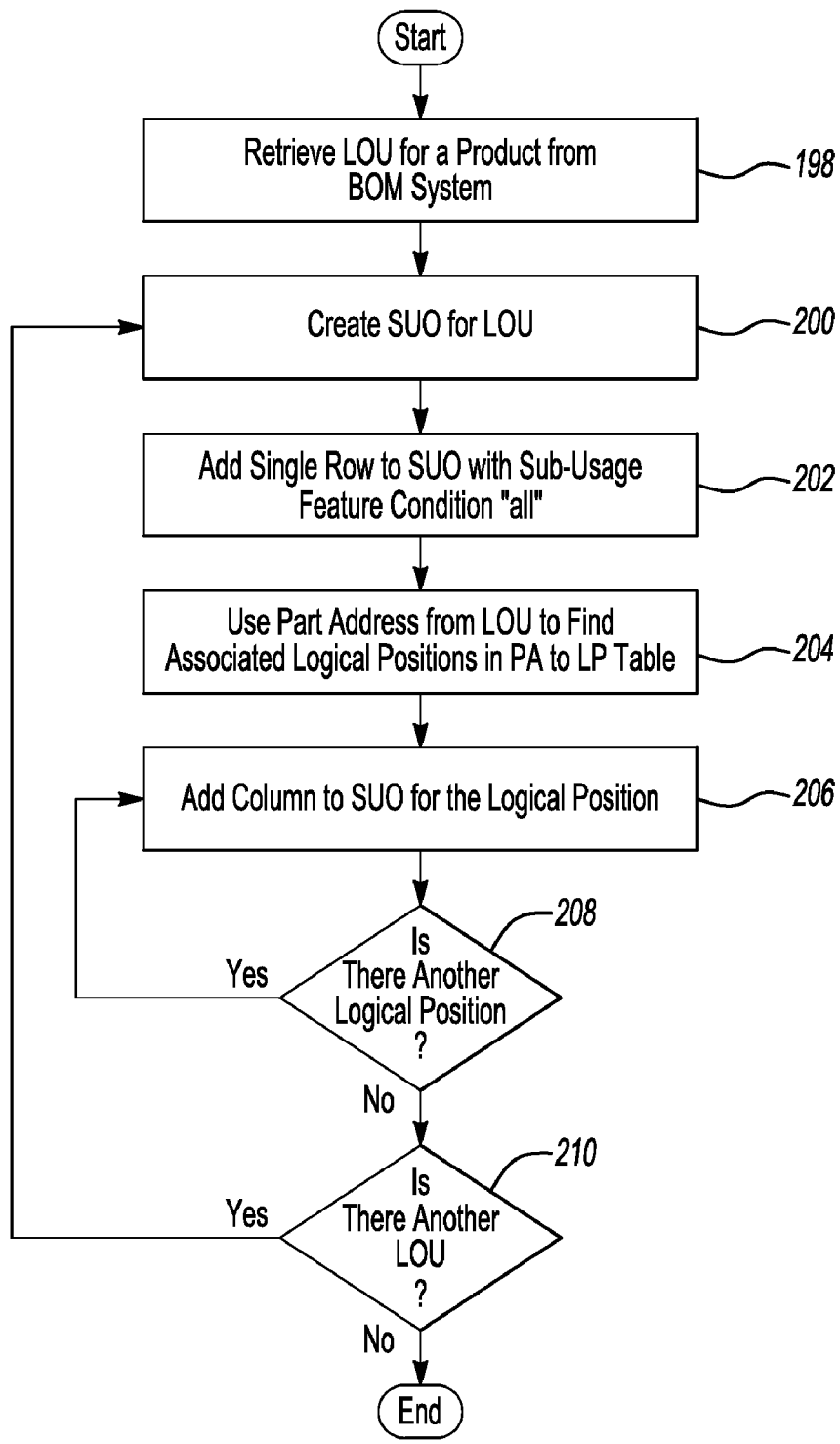
FIG. 5A is a flow chart of an example method for creating sub-usages for the usages of FIG. 4A.

FIG. 5A is a flow chart of an example method for creating sub-usages for the usages of FIG. 4A. At 198, LOU are retrieved for a product from a BOM system. At 200, a sub-usage object is created for the LOU. At 202, a single row is added to the sub-usage object with a sub-usage feature condition "all." At 204, a part address from the LOU is used to find associated logical positions in a part address to logical position (PA to LP) table. At 206, a column is added to the sub-usage object for the logical position, e.g., a reference to a single part within an LOU such as "Left Front." At 208, it is determined whether there is another logical position. If yes, the method returns to 206. If no, at 210, it is determined whether there is another LOU. If yes, the method returns to 200. If no, the method ends.

FIG. 5B is an example illustration of the method of FIG. 5A. PA to LP table 212 of FIG. 5B includes column headings for part address 214 and logical positions 216. PA to LP table 212 of FIG. 5B also includes rows 218, 220. PA to LP table 212 of FIG. 5B defines the logical positions that are associated with each part address and may be generated by hand based on experience. For example, the part address for row 218 "Wheels, Active" corresponds to the logical positions "Left Front, Right Front, Left Rear, Right Rear." The part address for row 220 "Wheels, Spare" corresponds to the logical position "Spare." As such, a part address is a way to uniquely define the application of a type of part to a vehicle.

BOM system 44 of FIG. 5B includes a column heading for part address 222.

Sub-usage object (SUO) 224 of FIG. 5B includes column headings left front 226, right front 228, left rear 230, and right rear 232. In the example of FIG. 5B, these column headings are indicative of the logical positions associated with the "Wheels, Active" part address information of row 218 of PA to LP table 212. SUO 224 also includes row 234. In the example of FIG. 5B, this row is indicative of the sub-usage feature condition associated with the "Premium Package" feature condition information of row 52 of BOM system 44. SUO 224 is generated by executing steps 198-200 of FIG. 5A. Row 234 of SUO 224 is generated by executing step 202 of FIG. 5A. Column headings 226-232 of SUO 224 are generated by executing steps 202-208 of FIG. 5A.

SUO 236 of FIG. 5B includes column heading spare 238. In the example of FIG. 5B, this column heading is indicative of the logical position associated with the "Wheels, Spare" part address information of row 220 of PA to LP table 212. SUO 236 also includes row 240. In the example of FIG. 5B, this row is indicative of the sub-usage feature condition associated with the "Alloy Spare" feature condition information of row 162 of BOM system 44. SUO 236 is generated by executing the steps of FIG. 5A.

Figure 6A:
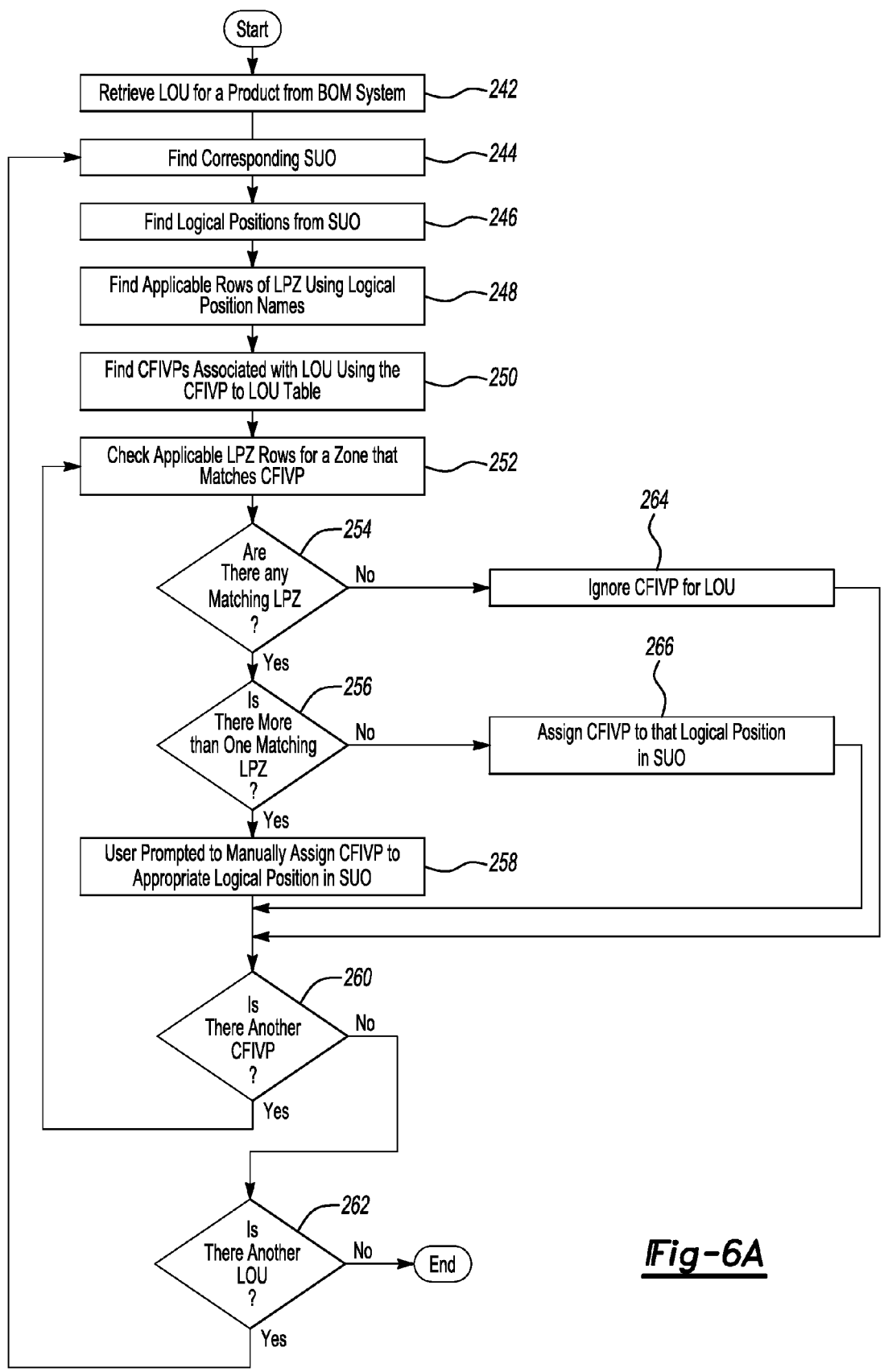
FIG. 6A is a flow chart of an example method for allocating CFIVPs to logical positions.

FIG. 6A is a flow chart of an example method for allocating CFIVPs to logical positions. At 242, LOU for a product are retrieved from a BOM system. At 244, corresponding sub-usage objects are found. At 246, logical positions from the sub-usage object are found. At 248, applicable rows of logical position zones (LPZ) using logical position names are found. At 250, CFIVP associated with the LOU are found using a CFIVP to LOU table. At 252, applicable LPZ rows are checked for a zone that matches the CFIVP. At 254, it is determined whether there are any matching LPZ. If yes, at 256, it is determined whether there is more than one matching LPZ. If yes, at 258, a user is prompted to manually assign a CFIVP to the appropriate logical positions in the sub-usage object. At 260, it is determined whether there is another CFIVP. If yes, the method returns to 252. If no, at 262, it is determined whether there is another LOU. If yes, the method returns to 244. If no, the method ends.

Referring to step 254, if no, at 264, the CFIVP for the LOU is ignored. The method then proceeds to 260.

Referring to step 256, if no, at 266, the CFIVP is assigned to that logical position in the sub-usage object. The method then proceeds to 260.

Figure 6B:
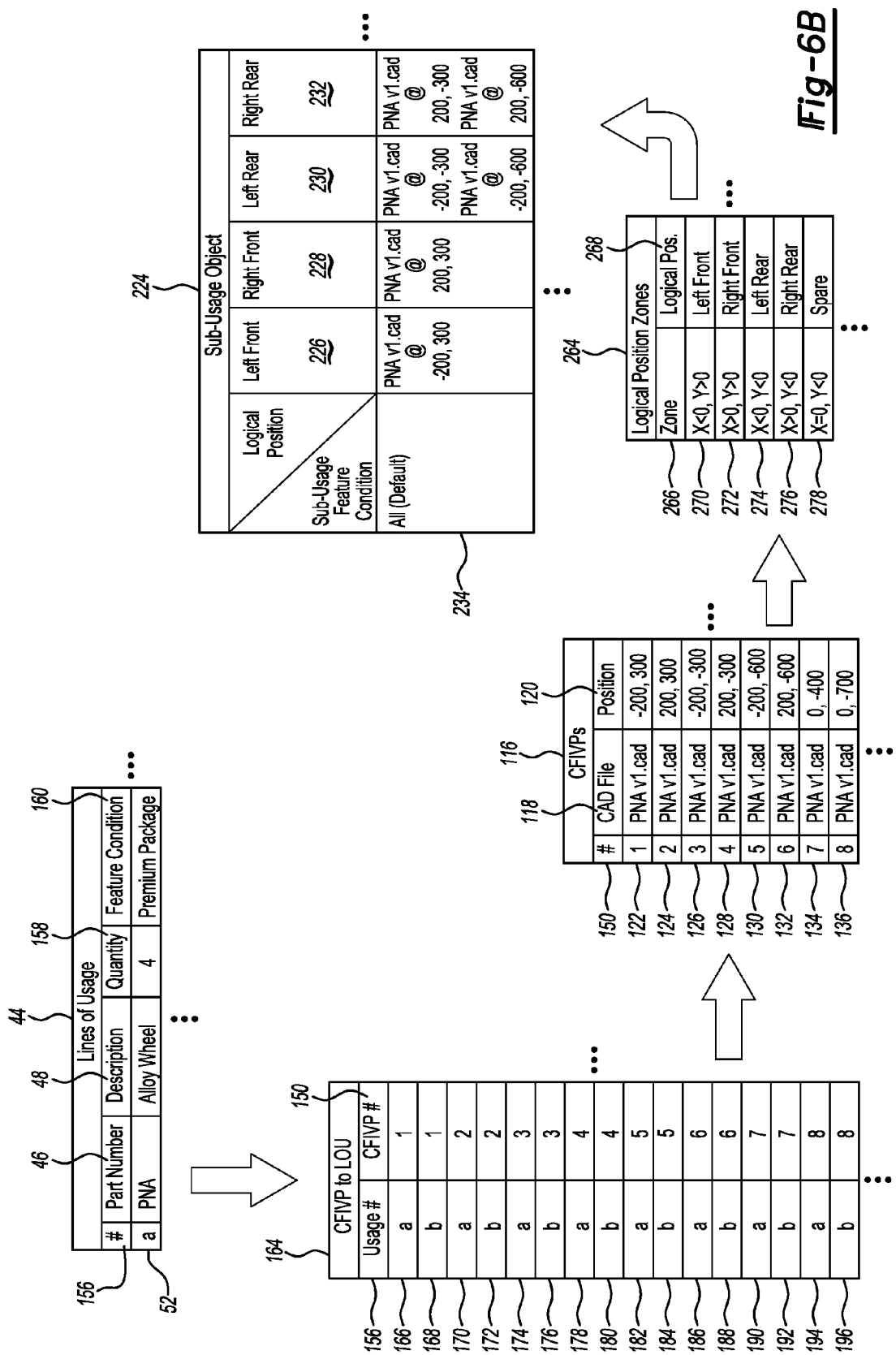
FIG. 6B is an example illustration of the method of FIG. 6A.

FIG. 6B is an example illustration of the method of FIG. 6A. LPZ table 264 of FIG. 6B may be generated by hand based on experience and used to allocate CFIVPs to the appropriate logical position. In the absence of LPZ table 264, such allocation may be done manually. LPZ table 264 of FIG. 6B includes column headings for zone 266 and logical position 268. LPZ table 264 also includes rows 270-278. Rows 270-278 define logical positions by relative geometric positions. For example, row 270 indicates that the logical position "Left Front" is defined as having an X location of less than 0 and a Y location of greater than 0 (see FIG. 3B, chart 134). Row 278 indicates that the logical position "Spare" is defined as having an X location equal to 0 and a Y location less than 0.

Referring to FIGS. 6A and 6B, at 242, line of usage 52 from BOM system 44 is retrieved. At 242, SUO 224 (FIG. 5B) is retrieved. At 246, SUO 224 is inspected to find the logical positions, e.g., "Left Front," "Right Front," "Left Rear," "Right Rear." At 248, LPZ table 264 is inspected fo find applicable rows of LPZ using the logical position names found at 246. At 250, each row of CFIVPs table 116 is associated with line of usage 52 using rows 166, 170, 174, 178, 182, 186, 190, 194 of CFIVP to LOU table 164. At 252, rows 270-278 of LPZ table 264 are checked for each row of CFIVPs table 116. At 254, for row 122 there is a matching LPZ. At 256, for row 122 there is not more than one matching LPZ. At 266, for row 122, "PNA v1.cad" of CFIVPs table 116 is assigned to row 234 under the column heading left front 226 of sub-usage object 224 because its position [-200, 300] from CFIVPs table 116 meets the definition of "Left Front" defined by LPZ table 264. Rows 124-136 are assigned in similar fashion following the steps of FIG. 6A. As a result, SUO 224 has multiple CFIVPs for the "Left Rear" and "Right Rear" logical positions.

Figure 7A:
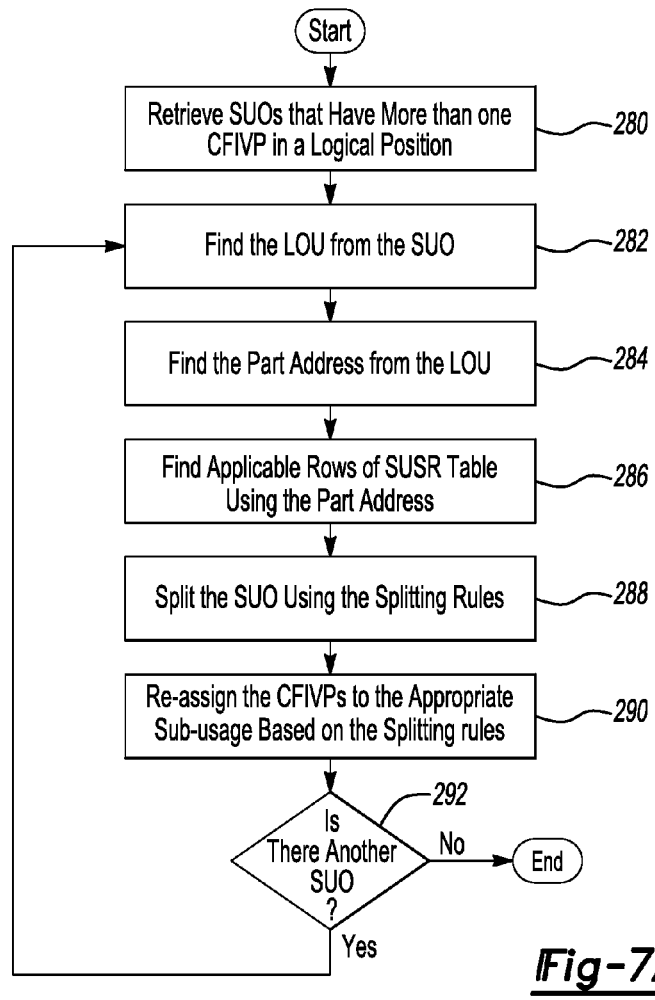
FIG. 7A is a flow chart of an example method for splitting the sub-usages and re-binning the CFIVPs of FIG. 5B.

FIG. 7A is a flow chart of an example method for splitting the sub-usages and re-binning the CFIVPs of FIG. 5B. At 280, SUOs that have more than one CFIVP in a logical position are retrieved. At 282, the LOU from the SUO is found. At 284, the part address from the LOU is found. At 286, applicable rows of a sub-usage splitting rules (SUSR) table are found using the part address. At 288, the SUO is split using the splitting rules. At 290, the CFIVP are re-assigned to the appropriate sub-usage based on the splitting rules. At 292, it is determined whether there is another SUO. If yes, the method returns to 282. If no, the method ends.

Figure 7B:
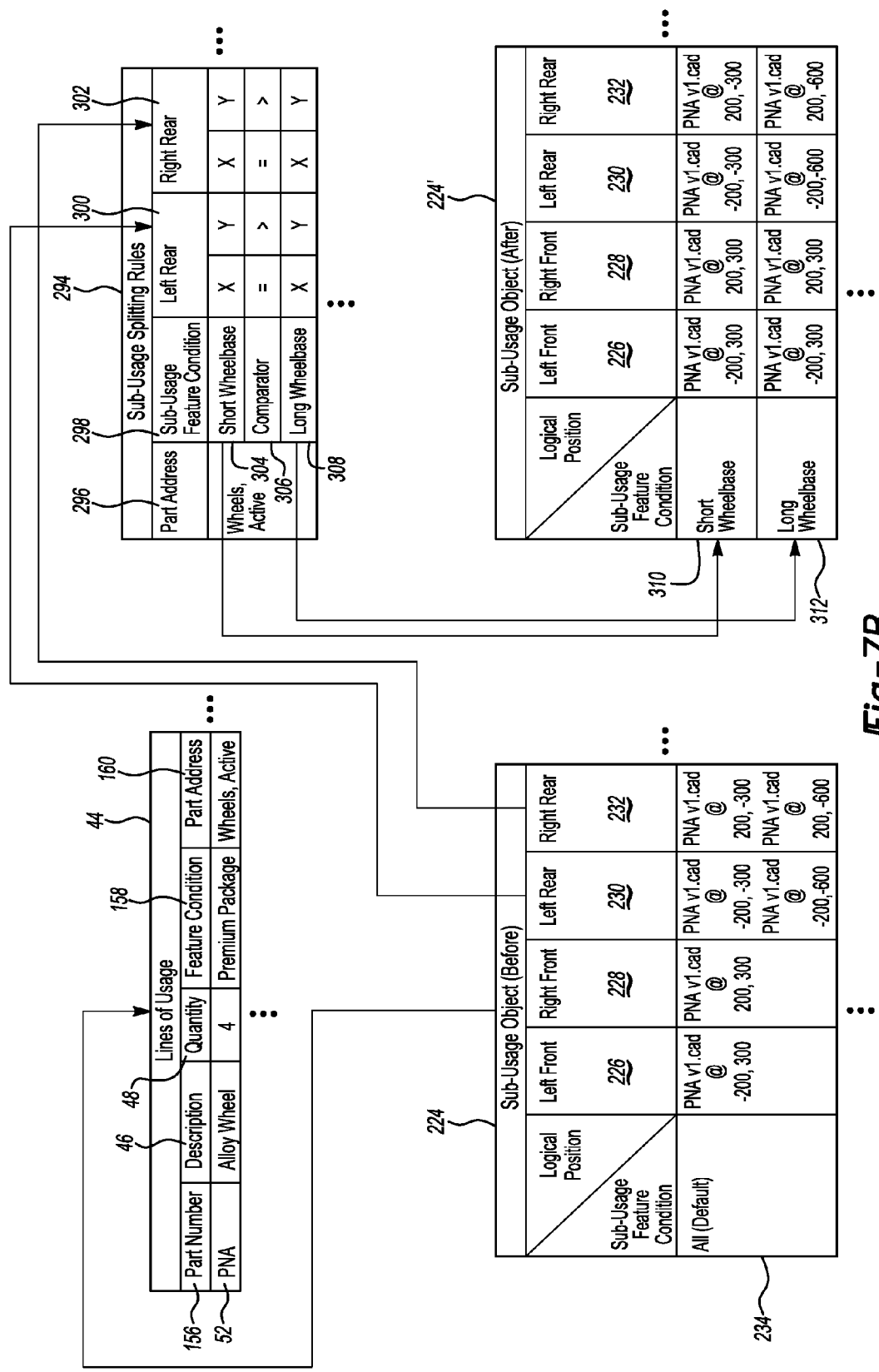
FIG. 7B is an example illustration of the method of FIG. 7A.

FIG. 7B is an example illustration of the method of FIG. 7A. Sub-usage splitting rules (SUSR) table 294 of FIG. 7B includes column headings for part address 296, sub-usage feature condition 298, left rear 300, and right rear 302. SUSR table 294 also includes rows 304, 306, 308 associated with part address "Wheels, Active." SUSR table 294 is used to split a single row of a SUO that has multiple CFIVPs, e.g., row 234 of SUO 224, into multiple rows. SUSR table 294 may be generated by hand based on experience.

Referring to FIGS. 7A and 7B, at 280, SUO 224 is retrieved. At 282, the LOU of row 52 of BOM system 44 is identified. At 284, the part address "Wheels, Active" is found from the LOU of row 52. At 286, rows 304, 308 of SUSR table 294 are identified based on the "Wheels, Active" part address. At 288, row 234 of SUO 224 is split using the splitting rules of SUSR table 294. For example, "PNA v1.cad" @ [−200, −300] and "PNA v1.cad" @ [−200, −600] are split using the splitting rules specified under column heading left rear 300 of SUSR table 294. The Y location of "PNA v1.cad" @ [−200, −300] is greater than the Y location of "PNA v1.cad" @ [−200, −600]. As such, "PNA v1.cad" @ [−200, −300] will be assigned to the "Short Wheelbase" Sub-Usage Feature Condition of SUO 224 and "PNA v1.cad" @ [−200, −600] will be assigned to the "Long Wheelbase" sub-usage feature condition of SUO 224. At 290, the CFIVP of SUO 224' are reassigned to the appropriate sub-usage feature condition based on the splitting rules, resulting in rows 310, 312. As such, feature conditions include information regarding vehicle content and/or part position.

The above processes would be performed for all CFIVPs associated with a vehicle. To build a particular configuration of a virtual vehicle, e.g., a short wheelbase vehicle with the premium package, the premium package and short wheelbase features would be specified and the CFIVPs whose conditions evaluated as true would be included in the virtual vehicle.

Figure 8:
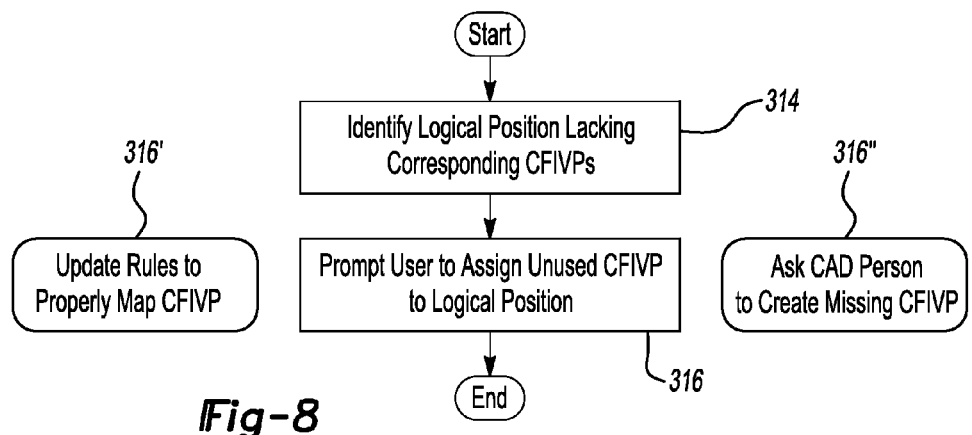
FIG. 8 is a flow chart of an example method for addressing logical positions lacking CFIVPs.

FIG. 8 is a flow chart of an example method for addressing logical positions lacking CFIVPs. At 314, logical positions lacking corresponding CFIVPs are identified. At 316, a user is prompted to assign unused CFIVPs to logical positions. Alternatively, at 316', rules to properly map the CFIVP may be updated. Alternatively, at 316", a CAD operator may be prompted to create the missing CFIVP. The method then ends.

The methods described herein may be embodied, for example, as executable code on a tangible medium, e.g., magnetic, optic, etc. The methods described herein may also be embodied, for example, in one or more programmed computers. Such one or more computers may retrieve BOM data, CAD data, Logical Position Zone data, etc., from remote servers via a network and perform the methods described herein. For example, a computer may retrieve data from a BOM system and a CAD system and execute steps 10-20 of FIG. 1. Such one or more computers may also, for example, store BOM data, CAD data, Logical Position Zone data, etc., locally and perform the methods described herein.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed:

1. A method for generating a configuration of an assembly from a design layout including a geometric representation of a part of the assembly and a bill of material including a part reference and a part address for the part of the assembly, the method comprising:

mapping the geometric representation of the part to the part reference from the bill of material;

generating positioned geometric representations of the part based on the mapping of the geometric representation of the part to the part reference;

identifying a logical position associated with the part based on the part address from the bill of material via a part address to logical position table;

mapping the positioned geometric representations of the part to the logical position based on logical position zones;

identifying a plurality of feature conditions based on the part reference and the part address; and mapping each of the positioned geometric representations of the part to one of the feature conditions to generate, via one or more computers, a configuration of the assembly from the design layout and bill of material.

2. The method of claim 1 wherein the logical position zones are defined by geometric rules.

3. A computer-readable storage medium having information stored thereon for directing a computer to perform the method of claim 1.

4. A system for generating a configuration of an assembly from a design layout including a geometric representation of a part of the assembly and a bill of material including a part reference and a part address for the part of the assembly, the system comprising:

one or more computers configured to map the geometric representation of the part to the part reference from the bill of material, generate positioned geometric representations of the part based on the mapping of the geometric representation of the part to the part reference, identify a logical position associated with the part based on the part address from the bill of material via a part address to logical position table, map the positioned geometric representations of the part to the logical position based on logical position zones, identify a plurality of feature conditions based on the part reference and the part address, and map each of the positioned geometric representations of the part to one of the feature conditions to generate a configuration of the assembly from the design layout and bill of material.

5. The system of claim 4 wherein the logical position zones are defined by geometric rules.

\* \* \* \* \*